United States Patent [19]

Olshansky

[11] Patent Number: 4,689,797
[45] Date of Patent: Aug. 25, 1987

[54] HIGH POWER SINGLE SPATIAL MODE SEMICONDUCTOR LASER

[75] Inventor: Robert Olshansky, Wayland, Mass.

[73] Assignee: GTE Laboratories Incorporated, Waltham, Mass.

[21] Appl. No.: 766,467

[22] Filed: Aug. 19, 1985

[51] Int. Cl.⁴ .............................................. H01S 3/19
[52] U.S. Cl. ...................................... 372/45; 372/19; 372/46; 372/50; 372/49
[58] Field of Search ....................... 372/45, 46, 19, 50, 372/49

[56] References Cited

U.S. PATENT DOCUMENTS

| | | | |
|---|---|---|---|
| 4,111,521 | 9/1978 | Streifer et al. | 372/50 |
| 4,219,785 | 8/1980 | Scifres et al. | 372/46 |
| 4,359,776 | 11/1982 | Acket et al. | 372/46 |
| 4,369,513 | 1/1983 | Umeda et al. | 372/50 |

OTHER PUBLICATIONS

Burnham et al., "Integrated Reflecting Polarizers in BH Diode Lasers", *Xerox Disclosure Journal*, vol. 4, No. 3, May/Jun. 1979, pp. 345-346.
Ikegami et al., "Planar Stripe with Waist/Notch (SWAN) Injection Laser", *Electronics Letters*, vol. 14, No. 24, Nov. 23, 1978, pp. 753-754.

*Primary Examiner*—James W. Davie
*Attorney, Agent, or Firm*—Fred Fisher

[57] ABSTRACT

A high power single spatial mode semiconductor laser provides strong lateral index guiding to maintain single transverse mode output and yet has a large cavity area. The large cavity area provides low series resistance, low thermal resistance, and lower operating current densities and photon densities than can be achieved by conventional cavity designs. The result is a laser which can operate at high output power at a single transverse mode. In the plane of the p-n junction, the active layer has a cross-section including a waveguide section of width between 1-2 microns which provides lateral mode stability and discrimination against high order transverse modes with a directly adjacent amplifier section consisting of a layer of about 5-20 microns width and several hundred microns in length. Due to the large cross section area of the amplifier section, the majority of the current flows through the amplifier section where most of the heat is generated. The device has only a few ohms series resistance and significantly lower thermal impedances than conventional narrow cavity design.

27 Claims, 4 Drawing Figures

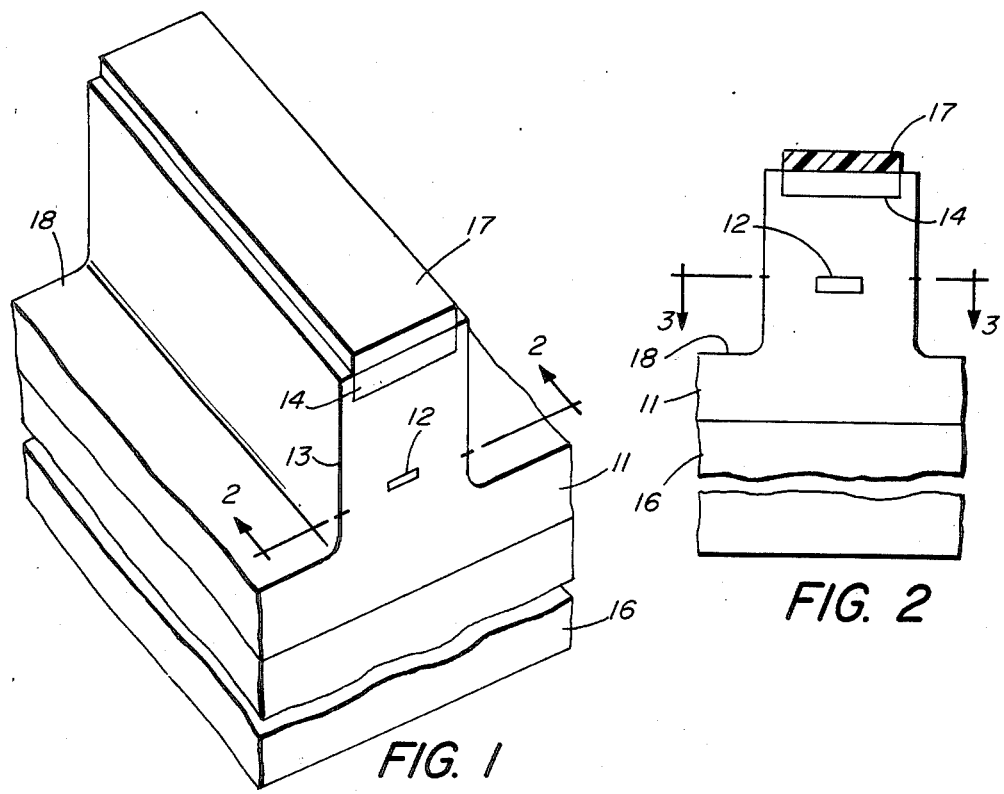
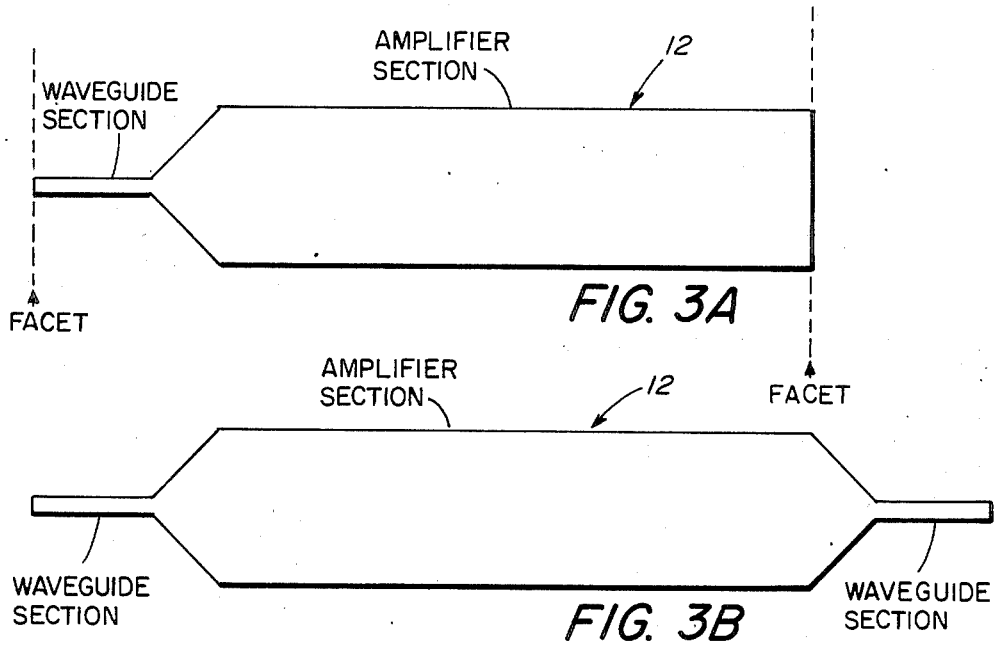

HIGH POWER SINGLE SPATIAL MODE SEMICONDUCTOR LASER

BACKGROUND OF THE INVENTION

1. Field of the Invention

This invention relates to high power single spatial mode semiconductor lasers. Accordingly, it is a general object of this invention to provide new and improved semiconductor lasers of such character.

2. Description of the Prior Art

U.S. Pat. No. 4,369,513, issued Jan. 18, 1983 to Umeda et al., discloses a semiconductor laser element having on a predetermined semiconductor substrate a stacked region for optical confinement including an active layer and clad layers, a first electrode disposed on the semiconductor substrate side and a second electrode disposed over the stacked region, and means for constructing an optical resonator, the semiconductor laser element comprising the fact that the means to inject current into the active layer is formed of a plurality of stripe conductive regions which are juxtaposed in traveling direction of a laser beam, and that laser radiations emitted in correspondence with th respective stripe conductive regions form a simply connected net and give rise to nonlinear interactions among them. As a typical example of the current injection means, the conductive regions have a strip-shaped pattern which includes a broader portion and a narrower portion. A coupled-multiple-stripe laser element in which the phases and wavelengths of the laser radiations of the respective strips are uniform is realized. The patent to Umeda et al., however, relates to an array of lasers coupled together; it is specifically concerned with a plurality of stripe conductive regions. In contradistinction, this instant invention relates to a single conductive region and a single laser cavity.

U.S. Pat. No. 4,359,776 for "Device for Generating or Amplifying Coherent Electromagnetic Radiation, and Method of Manufacturing the Device", issued Nov. 16, 1982 to Acket et al., discloses a semiconductor laser/amplifier in which the radiation oscillates only in one longitudinal mode in which, as stated therein, a strip-shaped active region exhibits periodic variations in amplification (and preferably also in the amplification profile) in its longitudinal direction over at least a part of its length. The period of the amplification variation is at least ten times the wavelength of the radiation. In general, Acket et al. describes a laser designed to produce a single longitudinal mode (single mode in wavelength) while, in contradistinction, the instant invention is directed to a laser designed to produce a single spatial mode. Acket et al. is directed to producing a spatially periodic amplification variation in the active region. In contradistinction, this instant novel invention, as described more fully hereinafter, does not require a periodic structure. This invention is directed to at least one wide region for providing amplification for high power and at least one narrow region for restricting amplification to a single spatial mode.

U.S. Pat. Nos. 4,11,521 issued Sept. 5, 1978 to Streifer et al. and 4,219,785 to Scifres et al. may be of interest for their showing of a narrow path connected to a separating double path in the active layer. Generally, however, these latter two patents deal with entirely different devices than those heretofore or hereinafter set forth.

SUMMARY OF THE INVENTION

Other objects of this invention are to provide new and improved high power single spatial mode semiconductor lasers which operate at higher power, lower series resistance, lower thermal resistance, lower operating current density, and lower photon desnity than conventional designs of the prior art.

In accordance with one aspect of this invention, a high power single spatial mode semiconductor laser includes an active layer of InGaAsP sandwiched between a layer of n-doped InP and a layer of p-doped InP to form a double heterostructure laser cavity. The layers of the n-doped InP and p-doped InP are joined together along a planar junction without the active layer. In the plane of the junction, the InGaAsP active layer has a narrow waveguide section which provides lateral mode stability and discrimination against high order transverse modes. The InGaAsP active layer also has an amplifier section that adjoins the waveguide section. In accordance with certain features of the invention, the high order transverse modes referred to herein includes all transverse modes in excess of a single transverse mode. The narrow waveguide section can have a width between 1 micron and 2 microns and a length of from 20 microns to 100 microns. The amplifier section can have a width from 5 microns to 20 microns and a length of several hundred microns. The active layer can include the waveguide section adjoining the amplifier section and further including a rear facet formed on the amplifier section distant from the waveguide section and a front facet formed on the waveguide section distant from the amplifier section. A dielectric film is coated on the rear facet to provide a reflectivity between 90 and 97% and the dielectric film is coated on the front facet to reduce the front facet reflectivity to below 10%.

In accordance with another aspect of the invention, a high power single spatial mode semiconductor laser includes an active layer of InGaAsP sandwiched between a layer of n-doped InP and layer of p-doped InP to form a double heterostructure laser cavity. The layers of the n-doped InP and the p-doped InP are joined together along a planar junction without the active layer. In the plane of the junction, the InGaAsP active layer has a first narrow waveguide section for providing lateral mode stability and discrimination against high order transverse modes. The first section has a first end having a front facet formed thereon and a second end. The InGaAsP active layer further has a second narrow waveguide section for providing lateral stability and discrimination against high order transverse modes. The second section has a first end with a rear facet formed thereon and second end. An amplifier section is positioned between the second ends of the waveguide sections. In accordance with certain features of this invention, the high order transverse modes include all transverse modes in excess of a single transverse mode. Each of the waveguide sections can have a width between 1 and 2 microns and a length from 20 to 100 microns. The amplifier section can have a width from 5 microns to 20 microns and a length of several hundred microns. The laser can further include a dielectric film coated on the rear facet to produce a reflectivity between 90 and 97%, and a dielectric film coated on the front facet to reduce the front facet reflectivity to below 10%.

In accordance with still another aspect of the invention, the semiconductor laser can be broadly construed to include a layer of n-doped first semiconductor material with bandgap energy $E_1$, a layer of p-doped second semiconductor material with bandgap energy $E_2$, and an active layer of a third semiconductor material with bandgap energy $E_3$ sandwiched between the first two layers to form a double heterostructure laser cavity. The first tow layers join together along a planar junction without the active layer. $E_3$ is less than $E_1$, and $E_3$ is less than $E_2$.

In yet another aspect of the invention, other materials can be used to construct the high power single spatial mode semiconductor laser. For example, a layer of n-doped $Al_xGa_{1-x}As$, a layer of p-doped $Al_yGa_{1-y}As$, and a active layer of $Al_zGa_{1-z}As$, such that $z<x$ and $z<y$ and $0<x<1$, $0<y<1$, and $0<z<1$.

BRIEF DESCRIPTION OF THE DRAWINGS

Other objects, advantages and features of this invention, together with its construction and mode of operation, will become more apparent from the following specification, when read in conjunction with the accompanying drawing, in which:

FIG. 1 is a perspective view of a double heterostructure wafer having multiple layers grown on a doped InP substrate, the substrate being shown broken away to indicate relative size, the thickness of the wafer being exaggerated for clarity of detail;

FIG. 2 is a cross-sectional view of the wafer depicted in FIG. 1, taken along the line 2—2 thereof;

FIG. 3a is a planar view of the active layer of the semiconductor wafer depicted in FIG. 2 taken along the line 3—3 thereof; and FIG. 3b is a view of another embodiment showing a planar view of the active layer of the wafer depicted in FIG. 2 taken along the line 3—3 thereof.

DETAILED DESCRIPTON

Referring to FIG. 1, there is depicted a perspective view of a vapor phase regrown (VPR) index diode guided laser. Both FIGS. 1 and 2 depict cross-sections of a wafer having layers of various thicknesses that are exaggerated for clarity of description. The fabrication process with such a laser is set forth in more particularity in U.S. patent application by W. Powazinik et al., Ser. No. 750,442, filed July 1, 1985, now abandoned. As stated therein, in a preferred embodiment, with specific measurements being given by way of example, four epitaxial layers include an 8 micron thick tin doped n-type $n=2-4\times10^{18} cm^3$) InP confining layer 11, epitaxially deposited thereupon a (100) oriented sulfur doped InP substrate 16. An undoped $In_{0.73}Ga_{0.27}As_{0.63}-P_{0.37}$ active layer 12 is epitaxially deposited thereupon. The active layer 12 preferably has an emission wavelength $\lambda=1.3$ microns and has a thickness $0.2\pm0.02$ micron. Upon such active layer 12 is epitaxially deposited, in a preferred embodiment, a 2.0 micron thick zinc doped p-type $(0.5-2\times10^{18}cm^{-3})$ confining layer 13 which in turn has a 0.5 micron thick zinc doped $In_{0.80}Ga_{0.20}As_{0.40}P_{0.60}$ contact/cap layer 14 thereupon.

A metal contact layer 17 is deposited on the double heterostructure wafer, specifically upon the layer 14.

The active layer 12, is indicated in FIGS. 1 and 2, represents the laser cavity. This invention is directed to the unique design thereof as depicted in one embodiment of FIG. 3a and in another embodiment of FIG. 3b.

The invention is directed to the unique design for the laser cavity which consists of two sections, a narrow waveguiding section of width between 1 micron to 2 microns which provides strong lateral stability and strong discrimination against higher order modes. The second section includes a wide amplifier section which provides a large reservoir of injected carriers required for high power laser operation. As most of the current flows into the wider amplifier section, the overall device can have low series resistance, low thermal impedance, and reduced operating current and photon densities.

The unique design of the active layer 12 is grown and fabricated using processes previously developed for fabrication of index guided lasers, such as those set forth in abandoned U.S. patent application No. 750,442 by W. Powazinik et al. referred to hereinabove.

The laser consists of an index guided laser formed in a InGaAsP/InP material system. The active layer 12 of InGaAsP of composition corresponding to a bandgap of 0.95 electron volts is sandwiched between layers 11, 13 of n-doped InP and p-doped InP to form a double heterostructure laser cavity. The thickness of the active layer 12 preferably is about 0.2 micron.

In the plane of the p-n junction formed by the layers 11 and 13, the InGaAsP active layer 12 has the following cross-section (see FIG. 3a). There is a waveguide section of width w between 1–2 microns which provides lateral mode stability and discrimination against higher order transverse modes. The waveguide section can be made of various lengths to achieve best operting characteristics. For example, the lengths can range from 20 to 100 microns. Directly adjacent to the waveguide section is an amplifier section consisting of a layer from 5 microns to 20 microns wide and several hundred microns in length. Due to the large cross-sectional area of the amplifier section, over 90% of the current flows into the amplifier section, where most of the heat is generated. The large width of the amplifier section makes it possible for this device to have a series resistance of only a few ohms and thermal impedances significantly lower than that achieved by conventional narrow cavity designs.

The rear facet (at the right of the figure as viewed) of this device is coatd with a dielectric film to produce a reflectivity chosen to be between 90–97%. The front facet (at the left of the figure) of the laser is coated with a dielectric film which reduces the facet reflectivity to below 10%. The low reflectivity front facet increases the differential quantum efficiency and insures a high conversion efficiency from electrical to optical power.

The InGaAsP active layer 12 described above is completely embedded in InP to form a buried heterostructure index-guided device. This index guided structure can be formed by the crystal growth techniques described generally in the literature, or by the vapor phase regrowth method set forth in the abandoned patent application No. 750,442 by w. Powazinik et al. set forth hereinabove.

The device described here, similar to that of the foregoing example, is shown in FIG. 3b. However, there, to increase the spatial mode stability a second waveguide section is added t the rear facet (at the right side of the figure). In this latter embodiment, the amplifier section, several hundred microns in length, is positioned between two waveguiding sections, each several tens of microns in length.

Vairous modifications will become more apparent to those who are ordinarily skilled in the art to which the invention pertains without departing from the spirit and scope thereof.

What is claimed is

1. In a high power single spatial mode semiconductor laser having a substrate, a resonant cavity, and electrodes, an apparatus wherein the improvement comprises a layer of n-doped indium phosphide (n-InP);
a layer of p-doped indium phosphide (p-InP);
an active layaer of InGaAsP sandwiched between said layers of n-InP and p-InP to form a double heterostructure laser cavity which functions as said resonant cavity, said layers of n-InP and p-InP joining together along a planar junction without said active layer, wherein, in the plane of said junction, said InGaAsP active layer has a narrow waveguide section which provides lateral mode stability and discrimination against high order transverse modes, and an amplifier section adjoining said waveguide section, said amplifier section having a length greater than that of said waveguide section, said amplifier section having a width greater than that of said waveguide section, and the sandwich of aid n-doped layer, said active layer, and said p-doped layer being coupled to said substrate, whereby said electrodes can be applied across said substrate and said sandwich.

2. The laser as recited in claim 1 wherein said high order transverse modes includes all transverse modes in excess of a single transverse mode.

3. The laser as recited in claim 1 wherein
said narrow waveguide section has a width between 1 $\mu$m and 2 $\mu$m, and a length of from 20 $\mu$m to 100 $\mu$m; and
said amplifier section has a width between 5 $\mu$m and 20 $\mu$m and a length of several hundred microns.

4. The laser as recited in claim 3 wherein said narrow waveguide section has a width of 1.5 $\mu$m.

5. The laser as recited in claim 3 wherein said active layer including said waveguide sectio adjoining said amplifier section further includes
a rear facet formed on said amplifier section, distant from said waveguide section;
a front facet formed on said waveguide section, distant from said amplifier section;
a dielectric film coated on said rear facet to produce a reflectivity between 90% and 97%; and
a dielectric film coated on said front facet to reduce front facet reflectivity to below 10%.

6. In a high power single spatial mode semiconductor laer having a substrate, a resonant cavity, and electrodes, an apparatus wherein the improvement comprises a layer of n-doped indium phosphide (n-InP);
a layer of p-doped indium phosphide (p-InP); and
an active layer of InGaAsP sandwiched between said layers of n-InP and p-InP to form a double heterostructure laser cavity which functions as said resonant cavity, said layers of n-InP and p-InP joining together along a planar junction without said active layer, wherein, in the plane of said junction, said InGaAsP active layer has
a first narrow wavelength section for providing lateral mode stability and discrimination against high order transverse modes, said first section having a first end having a front facet formed thereon, and a second end;
a second narrow waveguide section for providing lateral mode stability and discrimination against high order transverse modes, said second section having a first end having a rear facet formed thereon, and a second end; and
an amplifier section, wider than said narrow waveguide sections, positioned between said second ends of said waveguide sections,
said amplifier section having a length greater than that of said wavelength section, and
the sandwich of said n-doped layer, said active layer and said p-doped layer being coupled to said substrate, whereby said electrodes can be applied across said substrate and said sandwich.

7. The laser as recited in claim 6 wherein said high order transverse modes includes all transverse modes in excess of a single transverse mode.

8. The laser as recited in calim 6 wherein
each of said waveguide sections has a width between 1 $\mu$m and 2 $\mu$m, and a length of from 20 $\mu$m to 100 $\mu$m; and
said amplifier section has a width from 5 $\mu$m to 20 $\mu$m and a length of several hundred microns.

9. The laser as recited in claim 6 further comprising
a dielectric film coated on said rear facet to produce a reflectivity between 90% and 97%; and
a dielectric film coated on said front facet to reduce front facet reflectivity to below 10%.

10. In a high power single spatial mode semiconductor laser having a substrte, a resonant cavity, and electrodes, an apparatus wherein the improvement comprises a layer of first semiconductor material with bandgap energy $E_1$;
a layaer of p-doped second semiconductor material with bandgap energy $E_2$; and
an active layer of a third semiconductor material with bandgap energy $E_3$ sandwiched between said layers of said first material and said second material to form a double heterostructure laser cavity which functions as said resonant cavity, said layers of said first material and said second material joining together along a planar junction without said active layer, wherein, in the plane of said junction, said active layer has a narrow waveguide section which provides lateral mode stability and discrimination against high order transverse modes, and an amplifier section adjoining said waveguide section wherein $E_3 < E_1 < E_2$,
said amplifier section having a length greater than that of said waveguide section, said amplifier section having a width greter than that of said waveguide section, and
the sandwich of said layer of said first material, said active layer, and said layer of second material being coupled to said substrate, whereby said electrodes can be applied across said substrate and said sandwich.

11. The laser as recited in claim 10 wherein said high order transverse modes includes all transverse modes in excess of a single transverse mode.

12. The laser as recited in claim 10 wherein
said narrow waveguide section has a width between 1 $\mu$m and 2 $\mu$m, and a length of from 20 $\mu$m to 100 $\mu$m; and said amplifier section has a width between 5 μm and 20 μm and a length of several hundred microns.

13. The laser as recited in claim 12 wherein said narrow waveguide section has a width of 1.5 μm.

14. The laser as recited in claim 12 wherein said active layer including said waveguide section adjoining said amplifier section further includes
a rear facet formed on said amplifier section, distant from said waveguide section;
a front facet formed on said waveguide section, distant from aid amplifier section;
a dielectric film coated on said rear facet to produce a reflectivity between 90% and 97%; and
a dielectric film coated on said front facet to reduce front facet reflectivity to below 10%.

15. In a high power single spatial mode semiconductor laser having a substrate, a resonant cavity, and electrodes, an apparatus wherein the improvement comprises
a layer of n-doped first semiconductor material with bandgap energy $E_1$;
a layer of p-doped second semiconductor material with bandgap energy $E_2$; and
an active layer of a third semiconductor material with bandgap energy $E_3$ sandwiched between said layers of said first material and said second material to form a double heterostructure laser cavity which functions as said resonant cavity, said layers of said first material and said second material joining together along a planar junction without said active layer, wherein $E_3 < E_1$ and $E_3 < E_2$ and wherein, in the plane of said junction, said active layer has
a first narrow waveguide section for providing lateral mode stability and discrimination against high order transverse modes, said first section having a first end having a front facet formed thereon, and a second end;
a second narrow waveguide section for providing lateral mode stability and discriminantion against high order transverse modes, said second section having a first end having a rear facet formed thereon, and a second end; and
an amplifier section positioned between said second ends of said waveguide sections,
said amplifier section having a length greater than that of said waveguide section, said amplifier section having a width greater than that of said waveguide section, and
the sandwich of said first material, said third material, and said second material being coupled to said substrate, whereby said electrodes can be applied across said substrate and said sandwich.

16. The laser as recited in claim 15 wherein said high order transverse mode includes all transverse modes in excess of a single transverse mode.

17. The laser as recited in claim 15 wherein
each of said waveguide sections has a width between 1 μm and 2 μm, and a length of from 20 μm to 100 μm; and
said amplifier section has a width from 5 μm to 20 μm and a length of several hundred microns.

18. The laser as recited in claim 15 further comprising
a dielectric film coated on said rear facet to produce a reflectivity between 90% and 97%; and
a dielectric film coated on said front facet to reduce front facet refletivity to below 10%.

19. In a high power single spatial mode semiconductor laser having a substrate, a resonant cavity, and electrodes, an apparatus wherein the improvement comprises
a layer of n-doped $Al_xGa_{1-x}As$;
a layer of p-doped $Al_yGa_{1-y}As$; and
an active layer of $Al_zGa_{1-z}As$ such that $z < x$ and $z < y$ sandwiched between said layers of n−$Al_xGa_{1-x}As$ and p-$Al_yGa_{1-y}As$ to form a double heterostructure laser cavity which functions as said resonant cavity, said layers of n−$Aq_xGa_{1-x}As$ and p+$Al_yGa_{1-y}As$ joining together along a planar junction without said active layer, wherein, in the plane of said junction, said active layer has a narrow waveguide section which provides lateral mode stability and discrimination against high order transverse modes, and an amplifier section adjoining said waveguide section, wherein
$0 < x < 1$,
$0 < y < 1$, and
$0 < z < 1$,
said amplifier section having a length greater than that of said waveguide section, said amplifier section having a width greater than that of said waveguide section, and
the sandwich of n-doped layer, said active layer, and said p-doped layer being coupled to said substrate, whereby said electrodes can be applied across said substrate and said sandwich.

20. The laser as recited in claim 19 wherein said high order transverse modes includes all transverse modes in excess of a single transverse mode.

21. The laser as recited in claim 19 wherein
said narrow waveguide section has a width between 1 μm and 2 μm, and a length of from 20 μm to 100 μm; and
said amplifier section has a width between 5 μm and 20 μm and a length of several hundred microns.

22. The laser as recited in claim 21 wherein
said narrow waveguide section has a width of 1.5 μm.

23. The laser as recited in claim 21 wherein said active layer including said waveguide section adjoining said amplifier section further includes
a rear facet formed on said amplifier section, distant from said waveguide section;
a front facet formed on said waveguide section, distant from said amplifier section;
a dielectric film coated on said rear facet to produce a reflectivity between 90% and 97%; and
a dielectric film coated on said front facet to reduce front facet reflectivity to below 10%.

24. In a high power single spatial mode semiconductor laser having a substrate, a resonant cavity, and electrodes, and apparatus wherein the improvement comprises
a layer of n-doped $Al_xGa_{1-x}As$;
a layer of p-doped $Al_yGa_{1-y}As$; and
an active layer of $Al_zGa_{1-z}As$ such that $z < x$ and $z < y$ sandwiched between said layers of n-$Al_xGa_{1-x}As$ and p-$Al_yGa_{1-y}As$ to form a double heterostructure laser cavity which functions as said resonant cavity, said layers of n-$Al_xGa_{Ga1-x}As$ and p-$Al_yGa_{1-y}As$ joining together along a planar junction without said active layer, wherein $0 < x < 1$, $0 < y < 1$, and $0 < z < 1$, and wherein, in the plane of said junction, said active layer has
a first narrow waveguide section for providing lateral mode stability and discriminantion against high order transverse modes, said first section having a first end having a front facet formed thereon, and a second end;

a second narrow waveguide section for providing lateral mode stability and discrimination against high order transverse modes, said second section having a first end having a rear facet formed thereon, and a second end; and an amplifier section positioned between said second ends of said waveguide sections, said amplifier section having a length greater than that of said waveguide section, said amplifier section having a width greater than that of said waveguide section, and the sandwich of said n-doped layer, said active layer, and said p-doped layer being coupled to said substrate, whereby said electrodes can be applied across said substrate and said sandwich.

25. The laser as recited in claim 24 wherein said high order transverse modes includes all transverse modes in excess of a single transverse mode.

26. The laser as recited in claim 24 wherein each of said waveguide sections has a width between 1 $\mu$m and 2 $\mu$m, and a length of from 20 $\mu$m to 100 $\mu$m; and said amplifier section has a width about 5 $\mu$m to 20 $\mu$m and a length of several hundred microns.

27. The laser as recited in claim 24 further comprising a dielectric film coated on said rear facet to produce a reflectivity between 90% and 97%; and a dielectric film coated on said front facet to reduce front facet reflectivity to below 10%.

* * * * *